United States Patent [19]

Kondo et al.

[11] Patent Number: 5,370,965

[45] Date of Patent: Dec. 6, 1994

[54] POSITIVE-WORKING LIGHT-SENSITIVE COMPOSITION CONTAINING DIAZONIUM SALT AND NOVOLAK RESIN

[75] Inventors: Shunichi Kondo; Mitsumasa Tsuchiya, both of Shizuoka; Sadao Ishige; Takekatsu Sugiyama, both of Fujinomiya; Toshifumi Inno; Yoshimasa Aotani, both of Shizuoka, all of Japan

[73] Assignee: Fuji Photo Film Co., Ltd., Minami-Ashigara, Japan

[21] Appl. No.: 987,781

[22] Filed: Dec. 9, 1992

[30] Foreign Application Priority Data

Dec. 10, 1991 [JP] Japan .................................. 3-325859
Mar. 4, 1992 [JP] Japan .................................. 4-047179

[51] Int. Cl.$^5$ ............................................ G03F 7/021
[52] U.S. Cl. ...................................... 430/176; 430/163
[58] Field of Search ..................... 430/175, 176, 163

[56] References Cited

U.S. PATENT DOCUMENTS

| | | | |
|---|---|---|---|
| 3,219,447 | 11/1965 | Neugebauer et al. | 430/176 |
| 4,659,644 | 4/1987 | Hoshina et al. | 430/176 |
| 4,661,432 | 4/1987 | Lutz et al. | 430/176 |

*Primary Examiner*—Charles L. Bowers, Jr.
*Assistant Examiner*—Christopher G. Young
*Attorney, Agent, or Firm*—Burns, Doane, Swecker & Mathis

[57] ABSTRACT

A positive-working light-sensitive composition comprises a diazonium salt represented by the following general formula (I) and an alkali-soluble polymer:

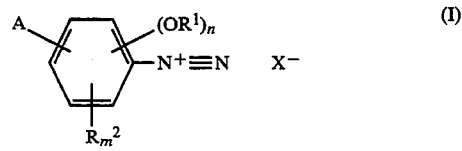

wherein $R^1$ represents a substituted or unsubstituted alkyl group having 3 to 18 carbon atoms; $R^2$ represents a hydrogen atom, a substituted or unsubstituted alkyl group, a substituted or unsubstituted aryl group, a substituted or unsubstituted alkoxy group, a substituted or unsubstituted phenoxy group or a halogen atom; A represents an organic group; $X^-$ represents a counterion or an anion; n is an integer ranging from 1 to 4 and m is an integer ranging from 1 to 3, provided that the sum of n and m is equal to 4. The positive-working light-sensitive composition has high sensitivity and can ensure the formation of clear images.

11 Claims, No Drawings

POSITIVE-WORKING LIGHT-SENSITIVE COMPOSITION CONTAINING DIAZONIUM SALT AND NOVOLAK RESIN

BACKGROUND OF THE INVENTION

The present invention relates to a positive-working light-sensitive composition which permits production or formation of lithographic printing plates, proofs of multicolor printings, drawings for overhead projectors and fine resist patterns in preparing integrated circuits of semiconductor elements.

There have conventionally been proposed various kinds of so-called positive-working light-sensitive compositions which can be solubilized through irradiation with actinic light rays as materials for preparing, for instance, lithographic printing plates. For instance, (i) a light-sensitive composition comprising a natural polymer such as albumen or glue or polyvinyl alcohol and bichromate; (ii) a light-sensitive composition comprising an o-quinonediazide compound; and (iii) a light-sensitive composition comprising a diazonium salt have been known. However, the foregoing light-sensitive compositions each has merits and demerits and they are thus still insufficient.

The light-sensitive composition (i) is economically advantageous since its price is reasonable, but the composition has low storage stability and other problems concerning handling thereof such as discard thereof arise since a bichromate is used as a starting material.

The foregoing light-sensitive compositions (ii) comprising o-quinonediazide compounds are excellent materials for forming positive images and have, in fact, widely been used for preparing, for instance, lithographic printing plates.

These o-quinonediazide compounds are disclosed in various publications, for instance, U.S. Pat. Nos. 2,766,118; 2,767,092; 2,772,972; 2,859,112; 2,907,665; 3,046,110; 3,046,111; 3,046,115; 3,046,118; 3,046,119; 3,046,120; 3,046,121; 3,046,122; 3,046,123; 3,061,430; 3,102,809; 3,106,465; 3,635,709; and 3,647,443.

These o-quinonediazide compounds are decomposed through irradiation with actinic light rays to give 5-membered carboxylic acids and to thus be made alkaline-soluble, but have insufficient light-sensitivity. This is because photochemical sensitization is difficult depending on the kinds of o-quinonediazide compounds and the quantum yield thereof never exceeds 1. Moreover, they are only sensitive to light rays of specific wavelengths. Therefore, they are insufficiently adapted for light sources and it is difficult to make them insensitive to white light. In addition, they greatly absorb light rays in the Deep UV region and, therefore, are not adapted for applications in which light rays of short wavelengths are used for improving the resolution of photoresists.

Various methods for eliminating these disadvantages have been proposed (see, for instance, Japanese Patent Publication for Opposition Purpose (hereinafter referred to as "J.P. KOKOKU") No. Sho 48-12242 (U.S. Pat. No. 3,661,582), Japanese Unexamined Patent Publication (hereinafter referred to as "J.P. KOKAI") No. Sho 52-40125 (U.S. Pat. No. 4,009,033) and U.S. Pat. No. 4,307,173), but the improvement is still insufficient.

Examples of the foregoing positive-working light-sensitive composition (iii) comprising a diazo compound are those disclosed in, for instance, U.S. Pat. Nos. 3,219,447 and 3,211,533, J.P. KOKOKU No. Sho 39-7663 and J.P. KOKAI No. Sho 52-2519, but they have low sensitivity and do not stably form images. Thus, they have been impracticable.

Alternatively, there have recently been proposed several compounds as new light-sensitive materials used in place of these positive-working light-sensitive compounds. One example thereof is a polymeric compound carrying o-nitrocarbinol ester groups as disclosed in J.P. KOKOKU No. Sho 56-2696 (U.S. Pat. No. 3,849,137). However, these compounds are still insufficient in sensitivity.

On the other hand, a photoresist has generally been used for forming a pattern in a method for producing electronic parts such as semiconductor elements, magnetic bubble memories and integrated circuits. Photoresists are divided into negative-working ones which are made insoluble in a developer through irradiation with light rays and positive-working ones which are, on the contrary, made soluble in a developer through irradiation with light rays. The negative-working photoresist has been one of mainstreams of photoresists till quite recently because of good sensitivity, excellent adhesion to a substrate which is favorable for the wet etching and high resistance to chemicals as compared with the positive-working photoresists. However, the formation of fine patterns (minute line widths and spaces between lines) has been required as the package density and degree of integration of semiconductor elements or the like have been increased and the dry etching technique has been used for etching substrates. These situations require that photoresists must have high resolution and high resistance to dry etching and accordingly, positive-working photoresists have recently been one of the mainstreams of photoresists. Among positive-working photoresists, those presently widely used are alkaline-developable positive-working photoresists mainly comprising alkali-soluble novolak resins as disclosed in, for instance, J. C. Strieter, Kodak Microelectronics Seminar Proceedings, 1976, p. 116 because of excellent sensitivity, resolution and resistance to dry etching.

However, there has intensity been required for making patterns more finer to further increase the package density and degree of integration and to respond to the demand for multifunctionalization of the recent electronic equipments and improvement of sensitivity thereof. To meet these requirements, there have been proposed light-sensitive composition comprising conventional o-quinonediazide light-sensitive compounds in combination with polysiloxanes which are made alkali-soluble or silicone polymers such as polysilmethylene, for instance, light-sensitive compositions such as those disclosed in, for instance, J.P. KOKAI Nos. Sho 61-256347, Sho 61-144639, Sho 62-159141, Sho 62-191849, Sho 62-220949, Sho 62-229136, Sho 63-90534 and Sho 63-91654 and a light-sensitive composition comprising a polysiloxane/carbonate block copolymer and an effective amount of an onium salt disclosed in J.P. KOKAI No. Sho 62-136638. However, these silicone polymers must be made alkaline-soluble. This makes the production thereof very difficult. Further, they have insufficient stability with time.

SUMMARY OF THE INVENTION

Accordingly, an object of the present invention is to provide a novel positive-working light-sensitive composition which permits the solution of the foregoing problems and more specifically to provide a novel positive-working light-sensitive composition having high sensitivity and capable of forming clear images.

Another object of the present invention is to provide a novel positive-working light-sensitive composition having high sensitivity and high storage stability and capable of forming clear images.

The inventors of this invention have searched for a novel positive-working light-sensitive composition which can be replaced with o-quinonediazide compounds and as a results, have found that a light-sensitive composition which has high sensitivity and can provide clear positive images can be obtained by incorporating a diazonium salt having a specific structure into an alkali-soluble polymer such as a cresol resin, that a light-sensitive composition which has high sensitivity and can provide clear positive images can be obtained by incorporating a diazonium salt having a specific structure into an alkali-soluble polymer such as a novolak resin and that the stability with time of the composition can substantially be improved by optimization of the composition and molecular weight of the novolak resin and thus have completed the present invention.

According to the present invention, there is provided a positive-working light-sensitive composition which comprises a diazonium salt represented by the following general formula (I) and an alkali-soluble polymer:

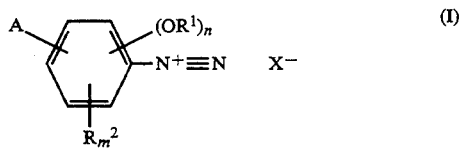

(I)

wherein $R^1$ represents a substituted or unsubstituted alkyl group having 3 to 18 carbon atoms; $R^2$ represents a hydrogen atom, a substituted or unsubstituted alkyl group, a substituted or unsubstituted aryl group, a substituted or unsubstituted alkoxy group, a substituted or unsubstituted phenoxy group or a halogen atom; A represents an organic group; $X^-$ represents a counterion or an anion; n is an integer ranging from 1 to 4 and m is an integer ranging from 0 to 3, provided that the sum of n and m is equal to 4.

At the present time, the reason why the positive-working light-sensitive composition provides clear positive images has not yet been clearly elucidated, but it would be assumed that, in unexposed areas, the diazonium salt of Formula (I) interacts with the alkali-soluble polymer to thus reduce the solubility of the light-sensitive layer formed from the composition in an alkali developer while, in exposed areas, the diazo compound of Formula (I) is decomposed through the action of irradiated light rays to thus increase the solubility of the light-sensitive layer in the alkali developer.

DESCRIPTION OF THE PREFERRED EMBODIMENTS

The positive-working light-sensitive composition of the present invention will be explained in more detail below.

The diazonium salt of Formula (I) used in the present invention is a compound in which at least one hydrogen atom on the benzene ring directly bonded to the diazo group is substituted with a long chain substituted or unsubstituted alkoxy group, the salt strongly interacts with the alkali-soluble polymer such as a cresol novolak resin through the effect of the long chain substituted or unsubstituted alkoxy group and as a result, it is made alkali-insoluble. This effect is called "solubilization-inhibitory effect". The alkoxy groups having not more than 3 carbon atoms exhibit only a very low solubilization-inhibition effect.

In addition, the diazonium salts of Formula (I) lose their solubilization-inhibitory effect through rapid decomposition by irradiation with light rays to thus give highly sensitive and clear positive images.

Among these, particularly effective diazonium salts are, for instance, those represented by the following general formulae (II), (III), (IV) and (V):

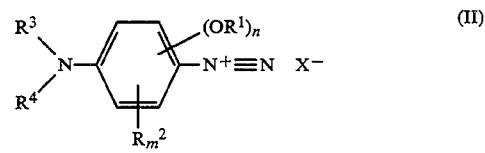

(II)

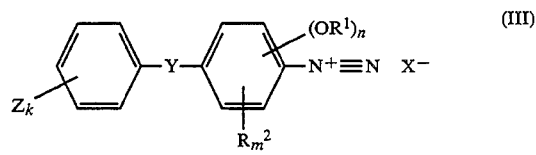

(III)

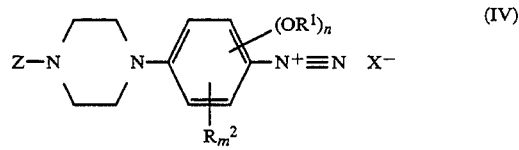

(IV)

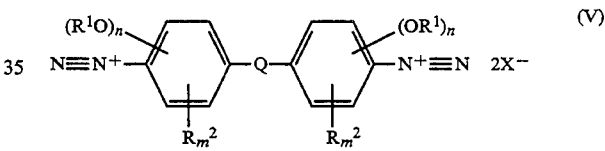

(V)

In the foregoing general formulae, $R^1$ represents a substituted or unsubstituted alkyl group having 3 to 18 carbon atoms; $R^2$ represents a hydrogen atom, a substituted or unsubstituted alkyl group, a substituted or unsubstituted aryl group, a substituted or unsubstituted alkoxy group, a substituted or unsubstituted phenoxy group or a halogen atom; $X^-$ represents a counterion or an anion; n is an integer ranging from 1 to 4 and m is an integer ranging from 1 to 3, provided that the sum of n and m is equal to 4.

$R^3$ and $R^4$ each independently represents a substituted or unsubstituted alkyl or aryl group, or $R^3$ and $R^4$ may be bonded together to form a heterocyclic group such as a morpholino, piperidino, piperazinyl or pyrrolidinyl group.

Y represents an oxygen atom, a sulfur atom, —NH—, —CH$_2$— or —C(CH$_3$)$_2$—.

Z represents a hydrogen atom, a substituted or unsubstituted alkyl group, a substituted or unsubstituted aryl group, a substituted or unsubstituted alkoxy group, a substituted or unsubstituted alkylcarbonyl group, a substituted or unsubstituted arylcarbonyl group, a cyano group, a nitro group or a halogen atom.

k is an integer ranging from 1 to 5.

Q is a divalent linking group.

The alkyl groups $R^1$ in Formulae (II) to (V) may be linear, branched or cyclic ones so far as they have carbon atom number of 3 to 18 and specific examples thereof include propyl, butyl, pentyl, hexyl and octyl groups.

The substituted alkyl groups denoted by $R^1$ may be alkyl groups having 1 to 10 carbon atoms substituted with halogen atoms such as chlorine atom, alkoxy groups having 1 to 5 carbon atoms such as methoxy group, phenoxy group and/or benzylthio group, provided that the total number of carbon atoms ranges from 3 to 18. Specific examples thereof are 4-chlorobutyl, 4-ethoxybutyl, 2-butoxyethyl, 4-phenoxybutyl and 2-benzylthioethyl groups.

The alkyl groups denoted by $R^2$ may be linear, branched or cyclic ones preferably having 1 to 10 carbon atoms and specific examples thereof are methyl, ethyl, butyl, hexyl and octyl groups.

The substituted alkyl group denoted by $R^2$ may be the alkyl groups defined above which are substituted with, for instance, halogen atoms such as chlorine atom and/or alkoxy groups having 1 to 5 carbon atoms such as methoxy group and specific examples thereof include 2-chloroethyl and 2-methoxyethyl groups.

The aryl groups denoted by $R^2$ are preferably mono or bicyclic ones, for instance, phenyl, α-naphthyl and β-naphthyl groups.

The substituted aryl groups of $R^2$ include, for instance, the aryl groups defined above which are substituted with alkyl groups having 1 to 5 carbon atoms such as methyl and ethyl groups, alkoxy groups having 1 to 5 carbon atoms such as methoxy and ethoxy groups and/or halogen atoms such as chlorine atom. Specific examples thereof are methylphenyl, dimethylphenyl, methoxyphenyl, chlorophenyl and methoxynaphthyl groups.

The alkoxy groups denoted by $R^2$ may be linear, branched or cyclic ones preferably having 1 to 18 carbon atoms and specific examples thereof include methoxy, ethoxy and butoxy groups.

The substituted alkoxy groups of $R^2$ are the alkoxy groups defined above which are substituted with halogen atoms, alkoxy groups having 1 to 5 carbon atoms, phenoxy group and/or benzylthio group and specific examples thereof are 4-chlorobutoxy, 4-ethoxybutoxy, 2-butoxyethoxy, 4-phenoxybutoxy and 2-benzylthioethoxy groups.

$X^-$ is an anion such as $BF_4^-$, $AsF_6^-$, $PF_6^-$, $SbF_6^-$, $SiF_6^-$, $ClO_4^-$, $CF_3SO_3^-$, $BPh_4^-$ (Ph represents a phenyl group), a condensed polynuclear aromatic sulfonate anion such as naphthalene-1-sulfonate anion or 9,10-diethoxyanthracene-2-sulfonate anion, a condensed polynuclear aromatic quinone sulfonate anion such as anthraquinone-2-sulfonate anion, an aromatic ketone sulfonate anion such as benzophenone-1-sulfonate anion or a sulfonate group-containing dye, but the present invention is not restricted to these specific examples.

The substituted or unsubstituted alkyl and aryl groups denoted by $R^3$ and $R^4$ in Formula (II) may be the same as those defined above in connection with the substituent $R^2$. Moreover, $R^3$ and $R^4$ may be bonded together to form a heterocyclic group such as a morpholino, piperidino, piperazinyl or pyrrolidinyl group as described above.

The substituted or unsubstituted alkyl, aryl and alkoxy groups denoted by Z in Formulae (III) and (IV) are the same as those defined above in connection with $R^2$.

The substituted or unsubstituted alkylcarbonyl and arylcarbonyl groups of Z are the substituted or unsubstituted alkyl and aryl groups defined above to which carbonyl groups are bonded. Further the substituents may be modified.

The substituent Q in Formula (V) is a divalent group for linking two diazo group-containing phenyl groups and examples thereof include those represented by the following general formulae, but the present invention is not restricted to these specific examples:

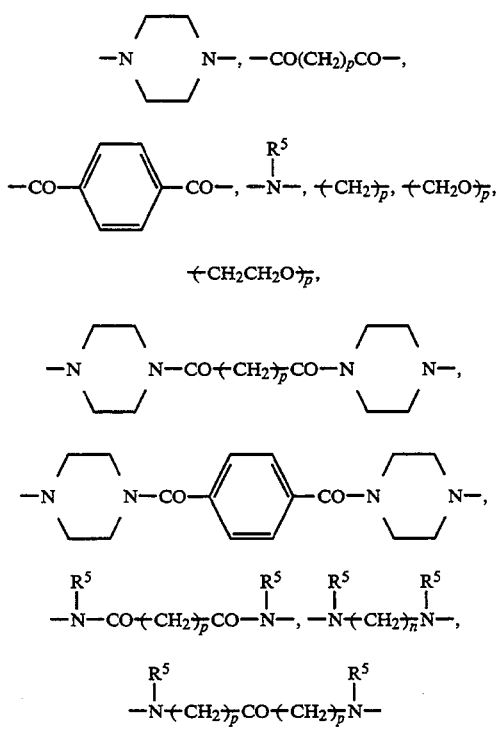

Wherein $R^5$ represents a substituted or unsubstituted alkyl or aryl group and p is an integer ranging from 1 to 10.

Specific examples of the compounds of Formula (I) used in the present invention, but the invention is not limited to these specific examples.

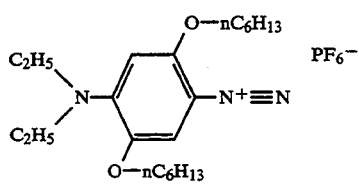

Compound 1

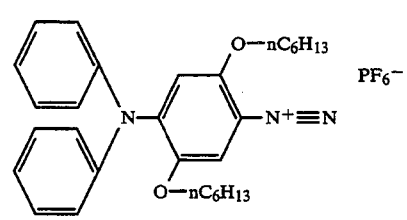

Compound 2

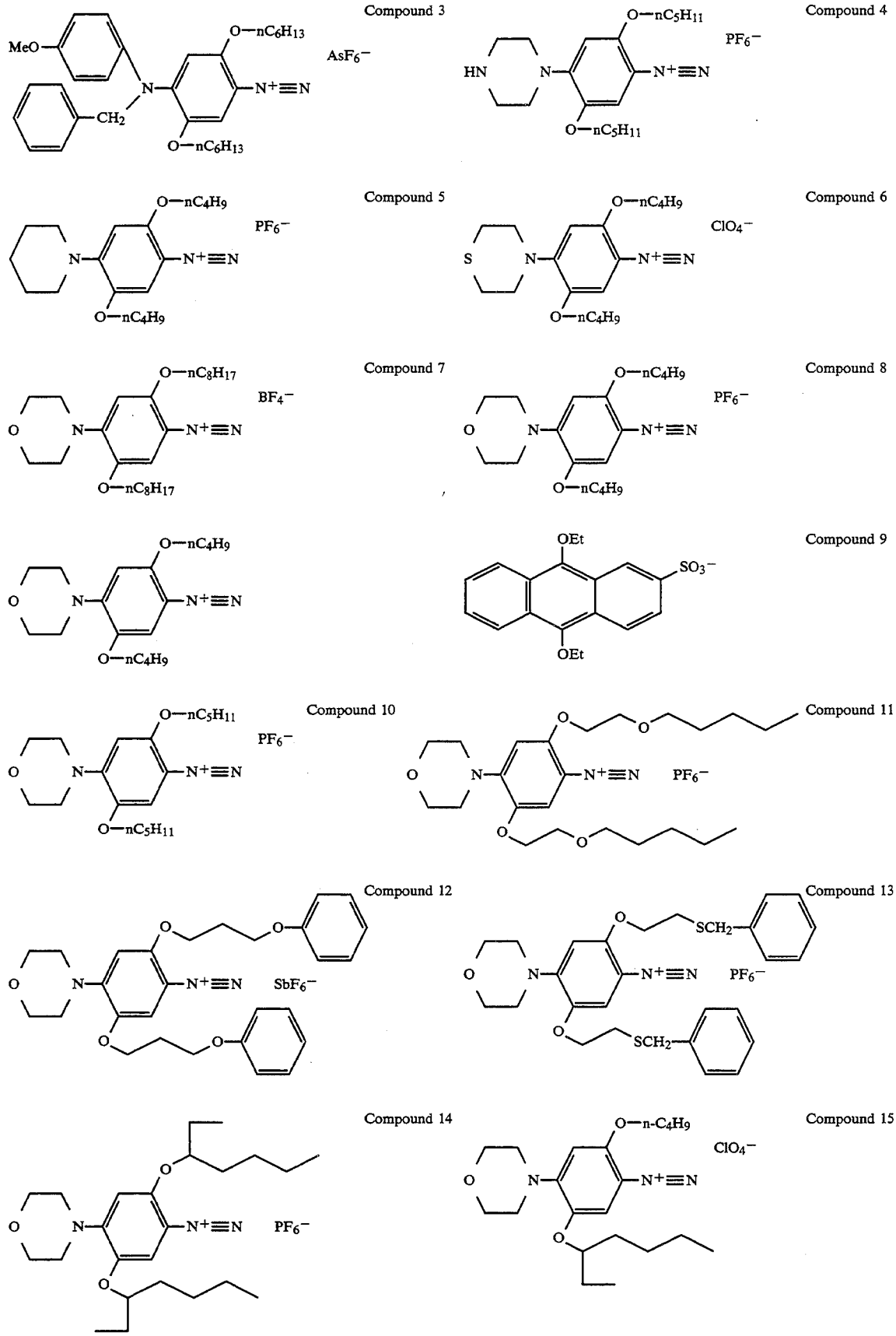

-continued
Compound 16
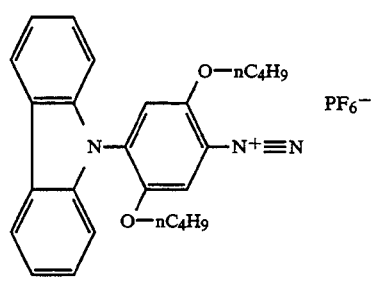 PF$_6^-$
Compound 17
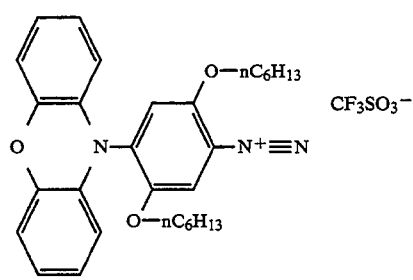 CF$_3$SO$_3^-$
Compound 18
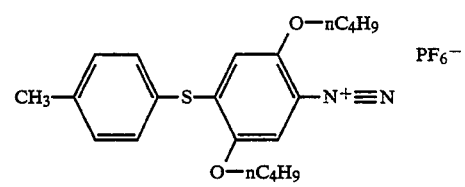 PF$_6^-$
Compound 19
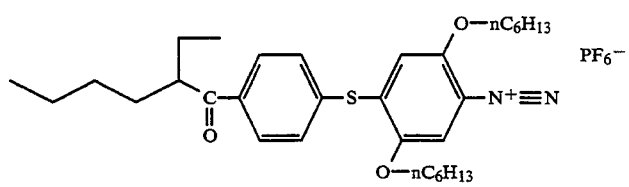 PF$_6^-$
Compound 20
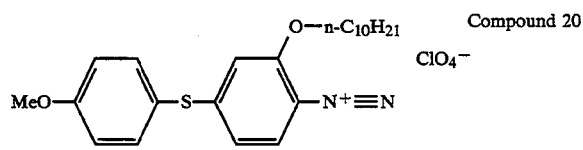 ClO$_4^-$
Compound 21
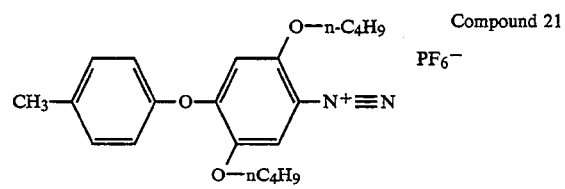 PF$_6^-$
Compound 22
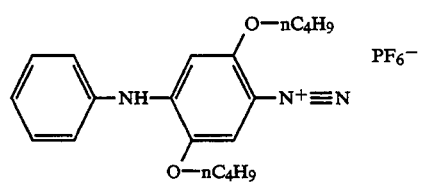 PF$_6^-$
Compound 23
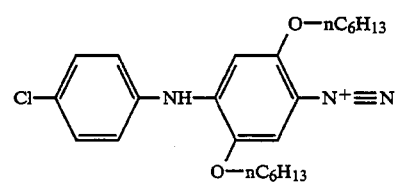 BF$_4^-$
Compound 24
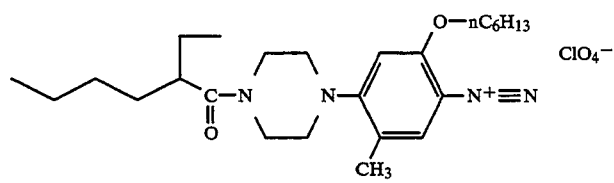 ClO$_4^-$
Compound 25
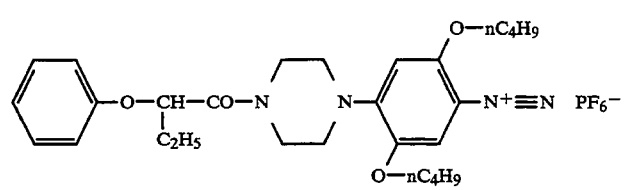 PF$_6^-$

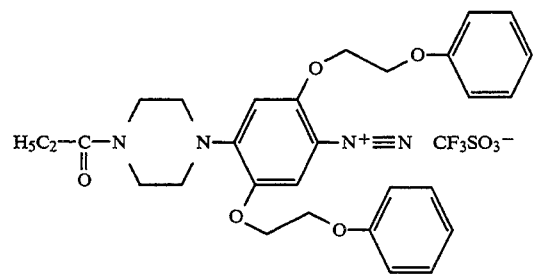

Compound 26

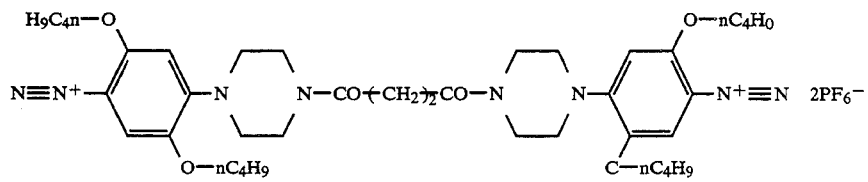

Compound 27

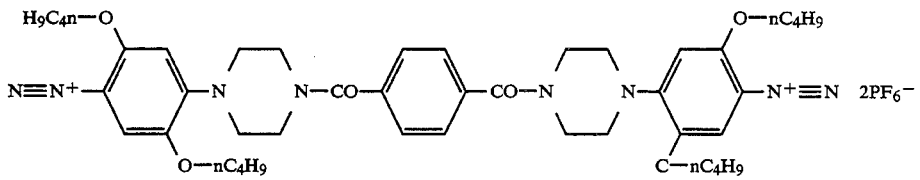

Compound 28

The compounds represented by Formula (I) may be used alone or in combination. The amount of the compound represented by Formula (I) (or that of the compound (II), (III), (IV) or (V)) added to the light-sensitive composition preferably ranges from 1 to 50% by weight and more preferably 5 to 30% by weight no the basis of the total weight of the solid content of the composition.

The alkali-soluble polymer used in the invention is preferably a polymer carrying acidic groups having a pKa value of not more than 11 such as phenolic hydroxyl group, carboxyl group, sulfonic acid group, imido group, sulfonamido group, N-sulfonylamido group, N-sulfonylurethane group and/or active methylene group.

Specific examples of preferred alkali-soluble polymers include novolak resins such as phenol-formaldehyde resin, o-cresol-formaldehyde resin, m-cresol-formaldehyde resin, p-cresol-formaldehyde resin, xylenol-formaldehyde resin and co-condensates thereof. Moreover, it is also possible to simultaneously use the foregoing novolak resins and condensates of phenol or cresol substituted with an alkyl group having 3 to 8 carbon atoms with formaldehyde such as t-butylphenol-formaldehyde resin as disclosed in J.P. KOKAI No. Sho 50-125806.

Examples of other alkali-soluble polymers usable in the present invention include polymers comprising, as copolymerized repeating units, those derived from phenolic hydroxyl group-containing monomers such as N-(4-hydroxyphenyl)methacrylamide, homopolymers or copolymers of p-hydroxystyrene, o-hydroxystyrene, m-isopropenylphenol and/or p-isopropenylphenol, and partially etherified or esterified derivatives of these polymers; polymers comprising, as copolymerized repeating units, those derived from carboxyl group-containing monomers such as (meth)acrylic acid, carboxyl group-containing polyvinyl acetal resins as disclosed in J.P. KOKAI No. Sho 61-267042, carboxyl group-containing polyurethane resins as disclosed in J.P. KOKAI No. Sho 63-124047, polymers comprising, as copolymerized repeating units, those derived from N-(4-sulfamoylphenyl)methacrylamide, N-phenylsulfonyl methacrylamide and/or maleimide, and active methylene group-containing polymers as disclosed in J.P. KOKAI No. Sho 63-127239.

Preferred novolak resins are, for instance, novolak type phenol resins having a m-cresol content ranging from 60 to 95% by weight and an average molecular weight ranging from 1,000 to 8,000 and specific examples thereof include m-cresol/phenol/formaldehyde resin, m-cresol/formaldehyde resin, m-cresol/o-cresol/formaldehyde resin, m-cresol/xylenol/ formaldehyde resin, m-cresol/bisphenol A/formaldehyde resin and co-condensates thereof. Moreover, it is also preferred to simultaneously use the foregoing novolak type phenol resins and co-condensates of phenol or cresol substituted with an alkyl group having 3 to 8 carbon atoms with m-cresol, formaldehyde such as t-butylphenol-formaldehyde resin as disclosed in J.P. KOKAI No. Sho 50-125806 (U.S. Pat. No. 4,123,276).

If the m-cresol content is less than 60% by weight, the interaction between the resin and the diazo compound is extremely high and accordingly, the apparent sensitivity of the light-sensitive layer formed from the composition is reduced, while if it exceeds 95% by weight, the interaction is small and the alkali-solubility of the unexposed area of the light-sensitive layer formed from the composition is not reduced to such an extent that positive images can be formed.

Moreover, if the weight-average molecular weight of the novolak resin is less than 1,000, the unexposed area is dissolved in an alkali developer, while if it exceeds 8,000, the solubility of the exposed area in the developer is insufficient. In addition, it exceeds 8,000, the interaction between the novolak resin and the diazo compounds increases with time and accordingly, both unexposed and exposed areas are liable to be highly insoluble in the developer.

The novolak resin used in the invention has an m-cresol content ranging from 60 to 95% by weight and a weight-average molecular weight ranging from 1,000 to 8,000, but preferably used novolak resin has an m-cresol content ranging from 80 to 93% by weight and a weight-average molecular weight ranging from 1,500 to 4,000.

These alkali-soluble resins may be used alone or in combination. The amount of these alkali-soluble polymer to be incorporated into the light-sensitive composition preferably ranges from 5 to 90% by weight and more preferably 10 to 90% by weight on the basis of the total weigth of the solid content of the composition.

The positive-working light-sensitive composition of the present invention may optionally comprise a variety of additives such as dyes, pigments and plasticizers.

Dyes used in the composition as coloring agents may be various kinds of known dyes, with oil-soluble dyes and basic dyes being preferred. Specific examples thereof include Oil Yellow #101, Oil Yellow #130, Oil Pink #312, Oil Green BG, Oil Blue BOS, Oil Black BY, Oil Black BS, Oil Black T-505 (these dyes are all available from Orient Chemical Industries, Ltd.), Crystal Violet (CI 42555), Methyl Violet (CI 42535), Rhodamine B (CI 45170B), Malachite Green (CI 42000) and Methylene Blue (CI 52015).

These dyes may be used alone or in combination and the amount thereof to be incorporated into the composition ranges from 0.01 to 10% by weight and preferably 0.1 to 3% by weight on the basis of the total weight of the solid content of the composition.

The positive-working light-sensitive composition of the invention may optionally comprise cyclic acid anhydrides and other fillers for further improvement of the sensitivity. Examples of such cyclic acid anhydrides are phthalic anhydride, tetrahydrophthalic anhydride, hexahydrophthalic anhydride, 3,6-endoxy-tetrahydrophthalic anhydride, tetrachlorophthalic anhydride, maleic anhydride, chloromaleic anhydride, $\alpha$-phenymaleic anhydride, succinic anhydride and pyromellitic anhydride as disclosed in U.S. Pat. No. 4,115,128. These cyclic acid anhydrides are preferably used in an amount ranging from 1 to 15% by weight on the basis of the total weight of the solid content of the composition to thus increase the sensitivity of the light-sensitive composition up to about 3 times.

The light-sensitive composition may likewise comprise compounds which can be hydrolyzed, with acids, into alkali-soluble compounds for increasing the difference between the solubilities of the exposed and unexposed areas. Examples of such compounds are disclosed in, for instance, J.P. KOKAI Nos. Sho 62-27829, Sho 63-250642, Sho 63-139343, Sho 59-45439 (U.S. Pat. No. 4,491,628), Sho 48-89003 (U.S. Pat. No. 3,779,778), Sho 51-120714 (U.S. Pat. No. 4,101,323), Sho 53-133429 (U.S. Pat. No. 4,247,611), Sho 55-126236 (U.S. Pat. No. 4,250,247), Hei 1-106038 and Sho 64-57258.

When the positive-working light-sensitive composition is used as a material for making a lithographic printing plate, the foregoing components are dissolved in a solvent and then applied onto the surface of a substrate. Alternatively, when the composition is used as a resist material for processing semiconductors or the like, it is used in the form of a solution. Examples of solvents used in these applications are ethylene dichloride, cyclohexanone, methyl ethyl ketone, methanol, ethanol, propanol, ethylene glycol monomethyl ether, 1-methoxy-2-propanol, ethylene glycol monoethyl ether, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, $\gamma$-butyrolactone, toluene and mixture thereof. The concentration of the solution (total solid content including all of the additives) preferably ranges from 2 to 50% by weight. When the composition is used in the form of a coated film, the coated amount of the solution in general ranges from 0.5 to 3.0 g/m$^2$ (solid content) for lithographic printing plates, and 0.1 to 3.0 g/m$^2$ (solid content) for photoresists. The lower the coated amount thereof, the higher the sensitivity, but the lower the physical properties of the light-sensitive film obtained.

When a lithographic printing plate is prepared using the positive-working light-sensitive composition of the invention, the foregoing solution containing the composition is applied onto the surface of a substrate. Examples of substrates include paper, paper laminated with a plastic film such as a polyethylene, polypropylene or polystyrene film, metal plates such as aluminum (including alloys thereof), zinc and copper plates, plastic films such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyvinyl acetal films, and paper and plastic films which are laminated with foils of the foregoing metals or on which the foregoing metals are vapor-deposited. Among these, the aluminum plate is particularly preferred, because of high dimensional stability and cheapness. Further, composite sheets comprising polyethylene terephthalate films bonded to aluminum sheets as disclosed in J.P. KOKOKU No. Sho 48-18327 are also preferred.

The surface of the aluminum plate is grained by a mechanical method such as a wire brush graining method, a brush graining method wherein the surface is roughened with a nylon brush while a slurry of abrsive particles is poured thereon, a ball graining method, a liquid honing method or a buff graining method; a chemical graining method wherein HF, AlCl$_3$ or HCl is used as an etchant; an electrolytic graining method wherein nitric acid or hydrochloric acid is used as an electrolyte; or a composite graining method wherein these surface-roughening methods are combined. Then the surface of the aluminum plate is etched, if necessary, with an acid or alkali. Subsequently, it is preferably subjected to anodization using a direct or alternating current in a solution of sulfuric acid, phosphoric acid, boric acid, chromic acid, sulfamic acid or a mixture thereof to form a passivation film on the aluminum surface.

The aluminum surface is made hydrophilic by the application of such a passivation film, but it is preferred to optionally subject it to an additional hydrophilization treatment. Particularly preferred hydrophilization treatments are, for instance, a treatment with a silicate such as sodium silicate or potassium silicate described in U.S. Pat. Nos. 2,714,066 and 3,181,461, a treatment with potassium fluorozirconate described in U.S. Pat. No. 2,946,638, a treatment with a phosphomolybdate described in U.S. Pat. No. 3,201,247, a treatment with an alkyl titanate described in U.K. Patent No. 1,108,559, a treatment with a polyacrylic acid described in German Patent No. 1,091,443, a treatment with a polyvinyl phosphonic acid described in German Patent No. 1,134,093 and U.K. Patent No. 1,230,447, a treatment with phosphonic acid described in J.P. KOKOKU No. Sho 44-6409, a treatment with phytic acid described in U.S. Pat. No. 3,307,951, application of an underlying coating of a complex of a water-soluble organic polymer wit a divalent metal ions described in J.P. KOKAI Nos. Sho 58-16893 and Sho 58-16291, or a hydrophilization treatment by application of an underlying coating of a water-soluble polymer having a sulfonate residue described in J.P. KOKAI No. Sho 59-101651. Other hydrophilization treatments include, for instance, a silicate electrodeposition method described in U.S. Pat. No. 3,658,662.

It is also preferred to perform a sealing treatment after the surface-graining treatment and anodization. The sealing treatment is carried out by immersing the plate in hot water or a hot aqueous solution of an inorganic or organic salt or by the use of a steam bath.

Alternatively, when the positive-working light-sensitive composition of the invention is used as a photoresist material, plates of various kinds of materials may be used as substrates. Examples thereof include a copper plate, a copper-plated plate, a silicon plate, a stainless steel plate and a glass plate.

The positive-working light-sensitive composition is applied onto the surface of the foregoing substrate by any known coating technique. Examples of such coating methods are coating with a whirler, wire bar coaing, dip coating, air-knife coating, roll coating, blade coating, curtain coating and spray coating methods.

The positive-working light-sensitive composition thus applied onto the substrate is dried at 40° to 150° C. for 30 seconds to 10 minutes using a hot-air dryer or an infrared dryer.

The presensitized plate for use in making a lithographic printing plate (hereinafter referred to as "PS plate") and photoresist comprising the positive-working light-sensitive composition of the invention are in general imagewise exposed to light and then developed.

Light sources of actinic light rays used for the imagewise exposure are, for instance, a mercury lamp, a metal halide lamp, a xenon lamp, a chemical lamp and a carbon arc lamp. Radiant rays may likewise be used as light sources and examples thereof include electron beams, X-radiation, ion beams and far ultraviolet rays. Light sources for photoresists preferably used in the invention include, for instance, g-rays, i-rays and Deep-UV rays. In addition, it is also possible to use a scanning exposure technique using high density energy beams (laser beam or electron beam). Examples of such laser beams are an He•Ne-laser, an Ar-laser, a Kr-laser, an He•Cd-laser and a KrF excimer laser.

The developers used for developing the positive-working light-sensitive composition of the invention are preferably aqueous solutions of inorganic alkali agents such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate and aqueous ammonia and organic alkali agents such as tetraalkylammonium hydroxide and the concentration thereof in the aqueous medium is adjusted to 0.1 to 10% by weight and preferably 0.5 to 5% by weight.

The alkaline aqueous solution as a developer may optionally comprise a surfactant and/or an organic solvent such as an alcohol.

The present invention will hereinafter be described in more detail with reference to the following non-limitative working Examples.

EXAMPLES 1 TO 15

A 2S aluminum plate having a thickness of 0.24 mm was degreased by immersing it in a 10% aqueous sodium tertiary phosphate solution maintained at 80° C. for 3 minutes followed by graining with a nylon brush, etching for about 10 minutes with a sodium aluminate solution and desmutting with a 3% aqueous sodium hydrogensulfate solution. The aluminum plate was then anodized at a current density of 2 A/dm$^2$ for 2 minutes in a 20% sulfuric acid solution.

Then 15 kinds of light-sensitive solutions $[A_0]$-1 to $[A_0]$-15 having the following formulation $[A_0]$ were prepared using compounds listed in the following Table 1. Each light-sensitive solution was applied onto the anodized aluminum plate and then dried at 100° C. for 2 minutes to give each corresponding PS plate. The coated amount of each light-sensitive solution was adjusted to 1.5 g/m$^2$ (weighed after drying).

| Formulation of Light-Sensitive Solution $[A_0]$ | |
| --- | --- |
| Component | Amount (g) |
| compound of Formula (I) | 0.2 |
| cresol/formaldehyde novolak resin (cresol/formaldehyde = 1/1; molecular weight (MW) = 2,000) | 1.0 |
| Oil Blue #603 (available from Orient Chemical Industries, Ltd.) | 0.01 |
| methyl ethyl ketone | 5 |
| methyl cellosolve | 15 |

A gray scale having a density difference of 0.15 was firmly attached to the light-sensitive layer of each PS plate thus prepared and the resulting assembly was exposed to light from a 2 KW high-pressure mercury lamp at a distance of 50 cm for 2 minutes. Each exposed PS plate was developed by immersing in an aqueous solution of DP-4 (trade name; Fuji Photo Film Co., Ltd.) diluted 8 times at 25° C. for 60 seconds. As a result, clear images were formed on all of the PS plates thus prepared. The results obtained are summarized in Table 1.

TABLE 1

| Ex. No. | Light-Sensitive Solution | Compound of Formula (I) | Step No. of Gray Scale |
| --- | --- | --- | --- |
| 1 | $[A_0]$-1 | Compound 1 | 5 |
| 2 | $[A_0]$-2 | Compound 4 | 6 |
| 3 | $[A_0]$-3 | Compound 5 | 6 |
| 4 | $[A_0]$-4 | Compound 7 | 7 |
| 5 | $[A_0]$-5 | Compound 8 | 8 |
| 6 | $[A_0]$-6 | Compound 10 | 8 |
| 7 | $[A_0]$-7 | Compound 11 | 9 |
| 8 | $[A_0]$-8 | Compound 12 | 8 |
| 9 | $[A_0]$-9 | Compound 13 | 7 |
| 10 | $[A_0]$-10 | Compound 14 | 7 |
| 11 | $[A_0]$-11 | Compound 18 | 8 |
| 12 | $[A_0]$-12 | Compound 21 | 4 |
| 13 | $[A_0]$-13 | Compound 22 | 8 |
| 14 | $[A_0]$-14 | Compound 24 | 6 |
| 15 | $[A_0]$-15 | Compound 27 | 8 |

EXAMPLES 16 TO 30

The same procedures used in Examples 1 to 15 were repeated except that 15 kinds of light-sensitive solutions $[A_1]$-1 to $[A_1]$-15 having the following formulation $[A_1]$ were prepared and used to give PS plates.

| Formulation of Light-Sensitive Solution [A₁] | |
|---|---|
| Component | Amount (g) |
| compound of Formula (I) | 0.2 |
| novolak resin | 1.0 |
| Oil Blue #603 (available from Orient Chemical Industries, Ltd.) | 0.01 |
| methyl ethyl ketone | 5 |
| methyl cellosolve | 15 |

The resulting PS plates each were exposed to light and developed in the same manner used in Examples 1 to 15 and as a result, clear positive images were formed on all of these PS plates. The results obtained are listed in the following Table 2.

TABLE 2

| Ex. No. | Light-Sensitive Solution | Compound of Formula (I) | Novolak Resin Used | Step No. of Gray Scale |
|---|---|---|---|---|
| 16 | [A₁]-1 | Compound 1 | cresol/formaldehyde resin (m/p = 85/15; MW = 2,000) | 5 |
| 17 | [A₁]-2 | Compound 4 | cresol/formaldehyde resin (m/p = 85/15; MW = 2,000) | 6 |
| 18 | [A₁]-3 | Compound 6 | cresol/formaldehyde resin (m/p = 85/15; MW = 2,000) | 6 |
| 19 | [A₁]-4 | Compound 8 | cresol/formaldehyde resin (m/p = 85/15; MW = 2,000) | 8 |
| 20 | [A₁]-5 | Compound 11 | cresol/formaldehyde resin (m/p = 85/15; MW = 2,000) | 9 |
| 21 | [A₁]-6 | Compound 22 | cresol/formaldehyde resin (m/p = 85/15; MW = 2,000) | 8 |
| 22 | [A₁]-7 | Compound 24 | cresol/formaldehyde resin (m/p = 85/15; MW = 2,000) | 6 |
| 23 | [A₁]-8 | Compound 27 | cresol/formaldehyde resin (m/p = 85/15; MW = 2,000) | 8 |
| 24 | [A₁]-9 | Compound 1 | cresol/formaldehyde resin (m/p = 83/17; MW = 1,500) | 9 |
| 25 | [A₁]-10 | Compound 1 | cresol/formaldehyde resin (m/p = 93/7; MW = 3,000) | 6 |
| 26 | [A₁]-11 | Compound 1 | m-cresol/xylenol/formaldehyde resin (m-c/x = 80/20; MW = 2,500) | 7 |
| 27 | [A₁]-12 | Compound 1 | m-cresol/xylenol/formaldehyde resin (m-c/x = 90/10; MW = 3,000) | 7 |
| 28 | [A₁]-13 | Compound 1 | m-cresol/phenol/formaldehyde resin (m-c/x = 90/10; MW = 2,500) | 8 |
| 29 | [A₁]-14 | Compound 1 | m-cresol/bisphenol A/foraldehyde resin (m-c/BP-A = 80/20; MW = 5,000) | 8 |
| 30 | [A₁]-15 | Compound 1 | m-cresol/bisphenol A/foraldehyde resin (m-c/BP-A = 90/10; MW = 8,000) | 7 |

EXAMPLES 31 to 35

Five kinds of light-sensitive solutions [B₀]-1 to [B₀]-5 were prepared using different compounds of Formula (I) (see Table 3) in a light-sensitive solution [B₀] having the following formulation and each was applied onto the surface of a silicon wafer having a thickness of 2 mm using a spinner and dried at 90° C. for 2 minutes on a hot plate, while adjusting the film thickness to 1 μ (determined after drying).

| Formulation of Light-Sensitive Solution [B₀] | |
|---|---|
| Component | Amount (g) |
| compound of Formula (I) | 0.2 |
| cresol/formaldehyde novolak resin (m-cresol/o-cresol = 7/3; MW = 1,600) | 1.0 |
| perylene | 0.003 |
| ethyl cellosolve acetate | 7.5 |

TABLE 3

| Ex. No. | Light-Sensitive Solution | Compound of Formula (I) |
|---|---|---|
| 31 | [B₀]-1 | Compound 4 |
| 32 | [B₀]-2 | Compound 8 |
| 33 | [B₀]-3 | Compound 13 |
| 34 | [B₀]-4 | Compound 24 |
| 35 | [B₀]-5 | Compound 27 |

Then each resulting photoresist layer was exposed to a monochromatic light of 436 nm using a reduction-projection exposure machine (stepper) and then developed with a 2.4% aqueous solution of tetramethylammonium hydroxide for 60 seconds to form a resist pattern. As a result, all of the samples could form patterns having good lines and spaces of 0.8 μm.

EXAMPLE 36

The resist obtained in Example 32 was irradiated with ultraviolet rays of 254 nm through a glass mask by a contact exposure method and then developed in the same manner used in Example 32. Thus, it was found that the resist could form a pattern having good lines and spaces of 0.7 μm.

EXAMPLES 37 TO 39

The same procedures used in Examples 31 to 35 were repeated except that the following light-sensitive solution [B₁] was substituted for the light-sensitive solution [B₀] to give resist layers.

| Formulation of Light-Sensitive Solution [B₁] | |
|---|---|
| Component | Amount (g) |
| compound of Formula (I) | 0.2 |
| m-cresol/p-cresol/formaldehyde resin (m/p = 72/28; MW = 2,500) | 1.0 |
| perylene | 0.003 |
| ethyl cellosolve acetate | 7.5 |

TABLE 4

| Ex. No. | Light-Sensitive Solution | Compound of Formula (I) |
|---|---|---|
| 37 | [B₁]-1 | Compound 4 |
| 38 | [B₁]-2 | Compound 8 |
| 39 | [B₁]-3 | Compound 13 |

Then each resulting photoresist layer was imagewise exposed to light and then developed in the same manner used in Examples 31 to 35 to form a resist pattern. As a result, all of the samples could form patterns having good lines and spaces of 0.8 μm.

EXAMPLE 40

The resist obtained in Example 38 was irradiated with ultraviolet rays of 254 nm through a glass mask by a contact exposure method and then developed in the same manner used in Example 38. Thus, it was found that the resist provided a good pattern having lines and spaces of 0.7 μm.

EXAMPLES 41 TO 45

The PS plates prepared in Examples 16 to 20 each was allowed to stand at 50° C., 70% RH for 5 days, followed by imagewise exposure to light and development in the same manner used in Examples 16 to 20 to evaluate the stability change of these PS plates with time. As a result, it was confirmed that all of these samples could form images almost identical to the clear positive images obtained in Examples 16 to 20.

Comparative Examples 1 to 3

The same procedures used in Example 1 were repeated except that comparative compounds listed in the following Table 5 were substituted for the compound 1 used in Example 1 to give light-sensitive solutions [$A_0$]-16 to [$A_0$]-18, each light-sensitive solution was applied onto the surface of an anodized aluminum plate and then dried at 100° C. for 2 minutes to give each corresponding PS plate. A gray scale having a density difference of 0.15 was firmly attached to the light-sensitive layer of each PS plate thus prepared and the resulting assembly was exposed to light from a 2 KW high-pressure mercury lamp at a distance of 50 cm for 2 minutes. Each exposed PS plate was developed by immersing in an aqueous solution of DP-4 diluted 8 times at 25° C. for 60 seconds. However, both exposed and unexposed areas were dissolved in the developer and any clear image was not formed at all.

resin used in Example 1 to give light-sensitive solutions [$A_1$]-16 to [$A_1$]-20, each light-sensitive solution was applied onto the surface of an anodized aluminum plate and then dried at 100° C. for 2 minutes to give each corresponding PS plate. A gray scale having a density difference of 0.15 was firmly attached to the light-sensitive layer of each PS plate thus prepared and the resulting assembly was exposed to light from a 2 KW high-pressure mercury lamp at a distance of 50 cm for 2 minutes. Each exposed PS plate was developed by immersing in an aqueous solution of DP-4 diluted 8 times at 25° C. for 60 seconds. The results obtained are listed in Table 6. Moreover, the PS plates of Comparative Examples 4 to 8 were allowed to stand at 50° C., 70% RH for 5 days and then imagewise exposed to light and developed in the same manner. The results obtained are likewise listed in Table 6. The PS plates of Comparative Examples could not form clear images prior to the test for stability change with time or provided clear images prior to the test, but did not steadily provide images of high quality since the exposed area was made insoluble in the developer after the test unlike the PS plates of Examples which could provide clear images prior to and after the test. More specifically, both the exposed and unexposed areas of the PS plates of Comparative Examples 4 to 6 were dissolved in the developer and did not provide any positive images. The PS plate of Comparative Example 7 provided a positive image, but the step number of solid step wedge was only 3 and the exposed area was made insoluble with time. The PS plate of Comparative Example 8 provided a positive image and the step number of solid step wedge was 5, but the sensitivity thereof was changed with time (the

TABLE 5

| Compara. Ex. No. | Light-Sensitive Solution | Comparative Compound Used |
|---|---|---|
| 1 | [$A_0$]-16 | Comparative Compound 1 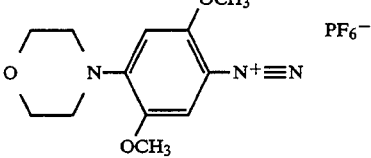 |
| 2 | [$A_0$]-17 | Comparative Compound 2 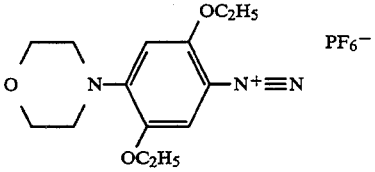 |
| 3 | [$A_0$]-18 | Comparative Compound 3 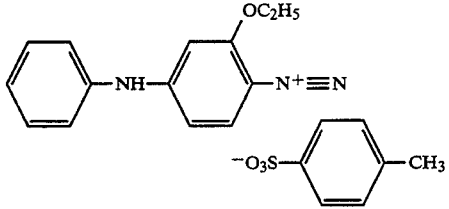 |

Comparative Examples 4 to 8

The same procedures used in Example 16 were repeated except that compounds listed in the following Table 6 were substituted for the compound 1 or novolak number of solid step wedge was lowered to 1).

TABLE 6

| Comp. Ex. No. | Light-Sensitive Solution | Compound Used | Novolak Resin Used |
|---|---|---|---|
| 4 | [A₁]-16 | Comparative Compound 1 | cresol/formaldehyde resin (m/p = 85/15; MW = 2,000) |
| 5 | [A₁]-17 | Comparative Compound 3 | cresol/formaldehyde resin (m/p = 85/15; MW = 2,000) |
| 6 | [A₁]-18 | Compound 8 | cresol/formaldehyde resin (m/p = 50/50; MW = 4,000) |
| 7 | [A₁]-19 | Compound 8 | cresol/formaldehyde resin (m/p = 99/1; MW = 9,000) |
| 8 | [A₁]-20 | Compound 8 | m-cresol/bisphenol A/formaldehyde resin (m-c/BP-A = 90/10; MW = 9,000) |

As has been discussed above in detail, the positive-working light-sensitive composition of the present invention has high sensitivity and can ensure the formation of clear images.

We claim:

1. A positive working light-sensitive composition comprising, together in admixture, a diazonium salt represented by the following formula (I) and an alkali-soluble polymer, wherein the diazonium salt is present in an amount of from 1 to 50% by weight based on the total weight of the solid content of the composition and the alkali-soluble polymer is present in an amount of from 5 to 99% by weight based on the total weight of the solid content of the composition, and further wherein the alkali-soluble polymer comprises a novolak resin:

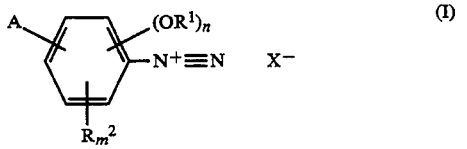

wherein $R^1$ represents a substituted or unsubstituted alkyl group having 3 to 18 carbon atoms; $R^2$ represents a hydrogen atom, a substituted or unsubstituted alkyl group, a substituted or unsubstituted alkyl group, a substituted or unsubstituted aryl group, a substituted or unsubstituted alkoxy group, a substituted or unsubstituted phenoxy group or a halogen atom; A represents an organic group; $X^-$ represents a counterion or an anion; n is an integer ranging from 1 to 4 and the sum of n and m is equal to 4.

2. The positive working light sensitive composition of claim 1, wherein the alkali soluble polymer comprises a novolak resin in combination with condensates of (i) phenol or cresol which are substituted with an alkyl group having 3 to 8 carbon atoms, with (ii) formaldehyde.

3. The positive-working light-sensitive composition of claim 1, wherein the diazonium salt represented by the general formula (I) is at least one member selected from the group consisting of those represented by the following general formulae (II), (III), (IV) and (V):

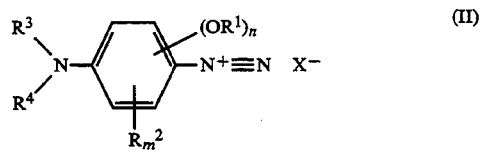

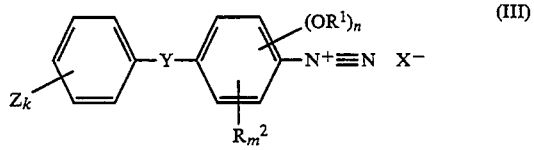

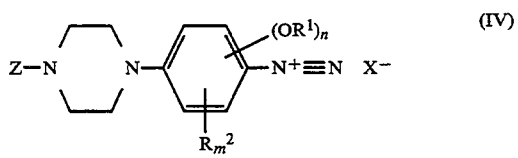

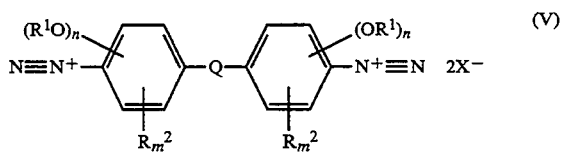

wherein $R^1$ represents a substituted or unsubstituted alkyl group having 3 to 18 carbon atoms; $R^2$ represents a hydrogen atom, a substituted or unsubstituted alkyl group, a substituted or unsubstituted aryl group, a substituted or unsubstituted alkoxy group, a substituted or unsubstituted phenoxy group or a halogen atom; A represents an organic group; $X^-$ represents a counterion or an anion; n is an integer ranging from 1 to 4 and m is an integer ranging 0 to 3, provided that the sum of n and m is equal to 4;

$R^3$ and $R^4$ each independently represents a substituted or unsubstituted alkyl or aryl group, provided that $R^3$ and $R^4$ may form a heterocyclic group;

Y represents an oxygen atom, a sulfur atom, —NH—, —CH₂— or —C(CH₃)₂—;

Z represents a hydrogen atom, a substituted or unsubstituted alkyl group, a substituted or unsubstituted aryl group, a substituted or unsubstituted alkoxy group, a substituted or unsubstituted alkylcarbonyl group, a substituted or unsubstituted arylcarbonyl group, a cyano group, a nitro group or a halogen atom;

k is an integer ranging from 1 to 5; and

Q is a divalent linking group.

4. The positive working light-sensitive composition of claim 3 wherein the diazonium salt is at least one member selected from the group consisting of those represented by the foregoing general formulae (II), (III), (IV) and (V), wherein the alkyl group $R^1$ may be a linear, branched or cyclic alkyl group having 3 to 18 carbon atoms; the substituted alkyl group $R^1$ is an alkyl group having 1 to 10 carbon atoms substituted with at least one substituent selected from the group consisting of halogen atoms and alkoxy groups having 1 to 5 carbon atoms, provided that the total number of carbon atoms ranges from 3 to 18; the alkyl group $R^2$ may be a linear, branched or cyclic alkyl group having 1 to 10 carbon atoms; the substituted alkyl group $R^2$ is one of the alkyl groups defined above which are substituted with at least one substituent selected from the group consisting of halogen atoms and alkoxy groups having 1 to 5 carbon atoms; the aryl group $R^2$ is a mono or bicyclic aryl group; the substituted aryl group $R^2$ is one of the aryl groups defined above which are substituted with at least one substituent selected from the group consisting of alkyl groups having 1 to 5 carbon atoms, alkoxy groups having 1 to 5 carbon atoms and halogen atoms; the alkoxy group $R^2$ may be a linear, branched or cyclic alkoxy group having 1 to 18 carbon atoms; the substituted alkoxy group $R^2$ is one of the alkoxy groups defined above which are substituted with at least one substituent selected from the group consisting of halogen atoms, alkoxy groups having 1 to 5 carbon atoms, phenoxy group and benzylthio group; $X^-$ is an anion selected from the group consisting of $BF_4'^-$, $AsF_6^-$, $PF_6^-$, $SbF_6^-$, $SiF_6^-$, $ClO_4^-$, $CF_3SO_3^-$, $BPh_4^-$ (Ph represents a phenyl group), a condensed polynuclear aromatic sulfonate anion, a condensed polynuclear aromatic quinone sulfonate anion, an aromatic ketone sulfonate anion and a sulfonate group-containing dye; the substituted or unsubstituted alkyl and aryl groups denoted by $R^3$ and $R^4$ are the same as those defined above in connection with the substituent $R^2$, or $R^3$ and $R^4$ may be bonded together to form a morpholino, piperidino, piperazinyl or pyrrolidinyl group; the substituted or unsubstituted alkyl, aryl and alkoxy groups denoted by Z are the same as those defined above in connection with $R^2$; the substituted or unsubstituted alkylcarbonyl and arylcarbonyl groups denoted by Z are the substituted or unsubstituted alkyl and aryl groups defined above to which carbonyl groups are bonded; the substituent Q is a divalent group for linking two diazo group-containing phenyl groups selected from the group consisting of those represented by the following general formulae:

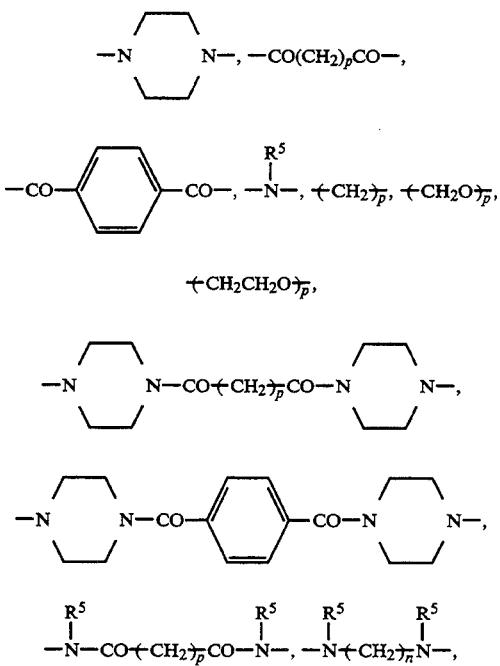

-continued

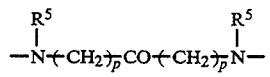

wherein $R^5$ represents a substituted or unsubstituted alkyl or aryl group and p is an integer ranging from 1 to 10.

5. The positive working light-sensitive composition of claim 3 wherein the amount of the compound represented by the general formula (II) to (V) to be incorporated into the composition ranges from 5 to 30% by weight on the basis of the total weight of the solid content of the composition.

6. The positive working light-sensitive composition of claim 1 wherein the alkali-soluble polymer is at least one member selected from the group consisting of polymers carrying acidic groups having a pKa value of not more than 11.

7. The positive working light-sensitive composition of claim 6 wherein the acidic group is selected from phenolic hydroxyl group, carboxyl group, sulfonic acid group, imido group, sulfonamido group, N-sulfonylamido group, N-sulfonylurethane group and active methylene group.

8. The positive working light-sensitive composition of claim 6 wherein the alkali-soluble polymer is selected from the group consisting of novolak resins; combinations of novolak resins with condensates of phenol or cresol substituted with an alkyl group having 3 to 8 carbon atoms with formaldehyde; polymers comprising, as copolymerized repeating units, those derived from phenolic hydroxyl group-containing monomers, homopolymers or copolymers of p-hydroxystyrene, o-hydroxystyrene, m-isopropenylphenol and/or p-isopropenylphenol, partially etherified or esterified derivatives or these polymers; polymers comprising, as copolymerized repeating units, those derived from carboxyl group-containing monomers such as (meth)acrylic acid, carboxyl group-containing polyvinyl acetal resins, carboxyl group-containing polyurethane resins, polymers comprising, as copolymerized repeating units, those derived from N-(4-sulfamoylphenyl)methacrylamide, N-phenylsulfonyl methacrylamide and/or maleimide, and active methylene group-containing polymers.

9. The positive-working light-sensitive composition of claim 1 wherein the alkali-soluble polymer is a novolak resin having an m-cresol content ranging from 60 to 95% by weight and a weight-average molecular weight ranging from 1,000 to 8,000.

10. The positive-working light-sensitive composition of claim 9 wherein the alkali-soluble polymer is a novolak resin having an m-cresol content ranging from 80 to 93% by weight and a weight-average molecular weight ranging from 1,500 to 4,000.

11. The positive-working light-sensitive composition of claim 1 wherein the content of the alkali-soluble polymer ranges from 10 to 90% by weight on the basis of of the total weight of the solid content of the composition.

* * * * *